(12) United States Patent
Akutsu et al.

(10) Patent No.: US 9,023,464 B2
(45) Date of Patent: May 5, 2015

(54) CONNECTING FILM, AND JOINED STRUCTURE AND METHOD FOR PRODUCING THE SAME

(75) Inventors: Yasushi Akutsu, Kanuma (JP); Tomoyuki Ishimatsu, Kanuma (JP); Koichi Miyauchi, Kanuma (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 12/838,625

(22) Filed: Jul. 19, 2010

(65) Prior Publication Data
US 2010/0285305 A1 Nov. 11, 2010

Related U.S. Application Data
(63) Continuation of application No. PCT/JP2009/069535, filed on Nov. 18, 2009.

(30) Foreign Application Priority Data

Nov. 20, 2008 (JP) ................................. 2008-296494

(51) Int. Cl.
*H01R 4/04* (2006.01)
*C09J 7/00* (2006.01)
(Continued)

(52) U.S. Cl.
CPC .................. *C09J 7/00* (2013.01); *C08K 3/0066* (2013.01); *C08K 3/08* (2013.01); *C08K 9/02* (2013.01); *C09J 2201/134* (2013.01);
(Continued)

(58) Field of Classification Search
USPC .................................................. 428/323, 413
See application file for complete search history.

(56) References Cited

U.S. PATENT DOCUMENTS 6,214,446 B1 4/2001 Funada et al.
6,340,607 B1 * 1/2002 Yamada ........................ 438/106
(Continued)

FOREIGN PATENT DOCUMENTS

JP 04-118873 A 4/1992
JP 06-045024 A 2/1994
(Continued)

OTHER PUBLICATIONS

Aerosil RY 200 product literature downloaded from https://www.aerosil.com/product/aerosil/en/products/special-products/pages/default.aspx on Sep. 15, 2014.*
(Continued)

*Primary Examiner* — Elizabeth A Robinson
(74) *Attorney, Agent, or Firm* — Buchanan, Ingersol & Rooney PC (57) ABSTRACT

A connecting film which electrically connects a first circuit member with a second circuit member having a nitrogen atom-containing film on a surface thereof facing the first circuit member, the connecting film including a first layer which is to be located at the first circuit member side, and a second layer which is to be located at the second circuit member side, wherein the first layer contains a cationic curing agent and an epoxy resin, and the second layer contains a radical curing agent, an acrylic resin and an epoxy compound, wherein one of the first layer and the second layer is a conductive particle-containing organic resin layer, and the other layer is an insulating organic resin layer containing no conductive particles, and wherein the minimum melt viscosity of the conductive particle-containing organic resin layer is ten times or more greater than that of the insulating organic resin layer.

12 Claims, 1 Drawing Sheet

(51) Int. Cl.
*H01L 23/00* (2006.01)
*H05K 3/32* (2006.01)
*C08K 3/00* (2006.01)
*C08K 3/08* (2006.01)
*C08K 9/02* (2006.01)
*H05K 1/03* (2006.01)

(52) U.S. Cl.
CPC ....... *C09J 2201/36* (2013.01); *C09J 2205/102* (2013.01); *C09J 2433/00* (2013.01); *C09J 2463/00* (2013.01); *H01L 24/83* (2013.01); *H01L 2224/32225* (2013.01); *H01L 2224/73204* (2013.01); *H01L 2224/838* (2013.01); *H01L 2924/01004* (2013.01); *H01L 2924/01005* (2013.01); *H01L 2924/01013* (2013.01); *H01L 2924/01015* (2013.01); *H01L 2924/01027* (2013.01); *H01L 2924/01029* (2013.01); *H01L 2924/01033* (2013.01); *H01L 2924/01042* (2013.01); *H01L 2924/01046* (2013.01); *H01L 2924/01047* (2013.01); *H01L 2924/01049* (2013.01); *H01L 2924/0105* (2013.01); *H01L 2924/01078* (2013.01); *H01L 2924/01079* (2013.01); *H01L 2924/01082* (2013.01); *H01L 2924/0781* (2013.01); *H01L 2924/14* (2013.01); *H01R 4/04* (2013.01); *H05K 1/0346* (2013.01); H05K 3/323 (2013.01); *H05K 2201/0154* (2013.01); *H05K 2201/10674* (2013.01); *H05K 2203/1189* (2013.01); H01L 24/32 (2013.01); *H01L 2224/2919* (2013.01); *H01L 2924/01006* (2013.01); *H01L 2924/01023* (2013.01); *H01L 2924/01024* (2013.01); *H01L 2924/01041* (2013.01); *H01L 2924/01045* (2013.01); *H01L 2924/014* (2013.01); *H01L 2924/0665* (2013.01); *H01L 2224/16225* (2013.01); *H01L 2924/07811* (2013.01); *H01L 2224/29082* (2013.01); *H01L 2224/2929* (2013.01); *H01L 2224/293* (2013.01); *H01L 2224/83192* (2013.01); *H01L 2224/83851* (2013.01)

(56) References Cited

U.S. PATENT DOCUMENTS

| 6,777,464 | B1 | 8/2004 | Watanabe et al. | |
|---|---|---|---|---|
| 2004/0068061 | A1* | 4/2004 | Kawate et al. | 525/530 |
| 2007/0090299 | A1* | 4/2007 | Kozakai et al. | 250/370.01 |
| 2010/0065303 | A1 | 3/2010 | Ishimatsu | |

FOREIGN PATENT DOCUMENTS

| JP | 11-251368 A | 9/1999 |
|---|---|---|
| JP | 2001-127107 A | 5/2001 |
| JP | 2003-045515 A | 2/2003 |
| JP | 3587859 B2 | 11/2004 |
| JP | 2005-235956 A | 9/2005 |
| JP | 2006-127776 A | 5/2006 |
| JP | 2007-027712 A | 2/2007 |
| JP | 2007-262412 A | 10/2007 |
| WO | WO 00/46315 A1 | 8/2000 |
| WO | WO 0046315 A1 * | 8/2000 |
| WO | WO 2008/133186 A1 | 11/2008 |

OTHER PUBLICATIONS

Ltd. Tetsutani Nippon Aerosil—Google machine translation of webpage http://www.tetsutani.co.jp/ganryou_evo_04.html downloaded on Sep. 13, 2014.*
International Search Report (PCT/ISA/210) for PCT/JP2009/054725 mailed on Jun. 16, 2009 in copending U.S. Appl. No. 12/626,279.
Written Opinion (PCT/ISA/237) for PCT/JP2009/054725 mailed on Jun. 16, 2009in copending U.S. Appl. No. 12/626,279.
International Search Report for PCT/JP2009/069535, completed Jan. 15, 2010.
Written Opinion of the International Searching Authority for PCT/JP2009/069535, completed Jan. 15, 2010 (in Japanese).

* cited by examiner

CONNECTING FILM, AND JOINED STRUCTURE AND METHOD FOR PRODUCING THE SAME

CROSS-REFERENCE TO RELATED APPLICATION

This is a continuation of Application No. PCT/JP2009/069535, filed on Nov. 18, 2009.

BACKGROUND OF THE INVENTION

1. Field of the Invention

The present invention relates to a connecting film, a joined structure, and a method for producing the joined structure. Specifically, the present invention relates to a connecting film capable of electrically and mechanically connecting circuit members such as IC chips and liquid crystal display panels (LCD panels) in liquid crystal displays (LCDs); a joined structure having the connecting film; and a method for producing the joined structure.

2. Description of the Related Art

Conventionally, as one means of connecting circuit members with each other, connecting material tapes (e.g., anisotropic conductive films (ACFs)) have been used, which are formed by coating a release film with a thermoplastic resin containing conductive particles dispersed therein.

The anisotropic conductive films are used for adhering and electrically connecting various terminals with each other, for example, for connecting flexible printed circuits (FPCs) and/or terminals of IC chips with indium tin oxide (ITO) electrodes on glass substrates of LCD panels.

One practically used connecting film is cationic-curable connecting films each containing a cationic curing agent and an epoxy resin. The cationic-curable connecting films realize curability at low temperatures and reduction of warpage of an adherend.

However, sulfonium salts, etc., serving as the cationic curing agent, have high curing activity and thus, the curing reaction is easily inhibited by, for example, even a trace amount of impurities, causing problematic phenomena such as poor curing.

In particular, such poor curing often occurs due to a passivation film of polyimide formed on the back surface of an IC chip. Specifically, in the case where an IC chip is connected via a cationic-curable connecting film, at the time when the cationic-curable connecting film is attached to the IC chip to initiate curing reaction, the generated cationic species ($H^+$) are inactivated by polyimide materials of the passivation film. One possible reason why the generated cationic species ($H^+$) are inactivated by the polyimide materials of the passivation film lies in that the cationic species ($H^+$) react with nitrogen atoms (N) contained in polyimide and are then trapped (the reaction $R_3N \rightarrow R_3N^+H$ occurs to form ammonium salts).

In addition, even when an IC chip is connected using a TAB tape formed by laminating a polyimide film on a Cu foil with an adhesive, the adhesive is made of polyamide and thus, causes inhibition of curing.

Another practically used connecting film is radical-curable connecting films each containing a radical curing agent (an organic peroxide) and an acrylic resin. The radical-curable connecting films are often employed for connection at the PWB side, and realize satisfactory curability at low temperatures. However, the radical-curable connecting films do not generate a hydroxyl group during curing and thus, the interaction between the film and the adherend having polarity becomes weak, causing problematic phenomena such as poor curing. In particular, the radical-curable connecting film has poor adhesion to the glass surface at the LCD panel side, problematically causing peeling at the interface.

A radical-curable connecting film in which an epoxy resin is contained is also known (Japanese Patent (JP-B) No. 3587859). In this case, the radical-curable connecting film also has poor adhesion to the glass surface.

The radical-curable connecting film, therefore, is not suitable for connection at the LCD panel side, and also is not used widely.

In addition, a rubber material commonly used as the material for a connecting film is easy to cause inhibition of curing.

Further, there is proposed a dual-curable connecting film containing a radical curing agent (for curing at low temperatures) and an imidazole curing agent (for curing at high temperatures) (for example, Japanese Application Laid-Open (JP-A) No. 2007-262412). However, a connecting film formed from components having different curing mechanisms tends to cause phase separation during curing and to involve inner cracks, resulting in degraded connection reliability. Also, curing must be performed at two steps, which is not suitable for connection in a short time.

Furthermore, proposed are a dual-curable connecting film formed from a radical curing agent and a cationic curing agent (for example, JP-A No. 2006-127776); a connecting film containing, in a binder, a heat-curable composition and a photo-curable composition (for example, JP-A No. 2005-235956); and a two-layered connecting film having a photo-cationic curing agent-containing layer and a photo-radical curing agent-containing layer (for example, International Publication No. WO00/084193). Neither of them can improve curing failure by a passivation film of polyimide formed on the back surface of an IC chip. Thus, demand has arisen for development of a connecting film which involves no curing failure by a passivation film of polyimide.

Further, in the recent display device members such as LCDs, PDPs and organic ELs, wires of metal such as Al, Mo, Cr, Ti, Cu or Ni are often formed on a base of ITO from the viewpoint of, for example, electrical conductivity. As these wires of metal lack light transparency, it is difficult to connect circuit members with each other by photo-curing a connecting film placed therebetween.

Moreover, a method is known in which difference in viscosity between the first layer and the second layer is made in a connecting film having the two layers, so as to improve efficiency of capturing conductive particles (for example, JP-A No. 06-45024). However, in this connecting film, the bonding force near the boundary between the first layer and the second layer is weak, and thus the conduction reliability may decrease.

Furthermore, a method is known in which a hydroxyl group-containing resin such as a phenoxy resin is contained in an adhesive so as to improve adhesion properties of the adhesive (For example, International Publication No. WO 00/046315). However, the adhesive disclosed in International Publication No. WO 00/046315 dose not employ two layers having mutually different viscosities, and the structure and effect of which are completely different from those of the present invention.

BRIEF SUMMARY OF THE INVENTION

The present invention aims at solving the problems in the art, and achieving the following object. An object of the present invention is to provide a connecting film which is excellent in both the efficiency of capturing the conductive particles and the conduction reliability, and a joined structure and a method for producing the joined structure.

The means for solving the aforementioned problem are as follow:

<1> A connecting film which electrically connects a first circuit member with a second circuit member having a nitrogen atom-containing film on a surface thereof facing the first circuit member, the connecting film including a first layer which is to be located at the first circuit member side, and a second layer which is to be located at the second circuit member side, wherein the first layer comprises a cationic curing agent and an epoxy resin, and the second layer comprises a radical curing agent, an acrylic resin and an epoxy compound, wherein one of the first layer and the second layer is a conductive particle-containing organic resin layer, and the other layer is an insulating organic resin layer containing no conductive particles, and wherein the minimum melt viscosity of the conductive particle-containing organic resin layer is ten times or more greater than the minimum melt viscosity of the insulating organic resin layer.

The connecting film described in <1> can improve adhesion strength to the circuit member, because the first layer containing a cationic curing agent and an epoxy resin is located at the first circuit member side, and the second layer containing a radical curing agent and an acrylic resin is located at the second circuit member side, wherein the second circuit member has a nitrogen atom-containing film on a surface thereof facing the first circuit member.

Moreover, by making the minimum melt viscosity of the conductive particle-containing organic resin layer to be ten times or more greater than the minimum melt viscosity of the insulating organic resin layer, the efficiency of capturing the conductive particles can be improved. As a result, the connecting film can be applied to fine pitch connection.

In a connecting film consisting of two layers having mutually different viscosities, the two layers are hard to mix with each other upon pressure-bonding, and thus phase separation usually occurs, which causes poor bonding force between the layers. On the other hand, in the present invention, the epoxy compound contained in the second layer reacts with the epoxy resin contained in the first layer, so that the bonding force between the first layer and the second layer can be improved.

<2> The connecting film according to <1>, wherein the epoxy compound has a molecular weight of 900 to 50,000, and an epoxy equivalent of 450 to 5,000.

<3> The connecting film according to any of <1> and <2>, wherein the second layer contains hydroxyl group-containing acrylate.

<4> A joined structure including a first circuit member; and a second circuit member having a nitrogen atom-containing film on a surface thereof facing the first circuit member; and the connecting film according to any of <1> to <3>.

The joined structure described in <4> can improve adhesion strength to the circuit member, because the first layer containing a cationic curing agent and an epoxy resin is located at the first circuit member side, and the second layer containing a radical curing agent and an acrylic resin is located at the second circuit member side, wherein the second circuit member has a nitrogen atom-containing film on a surface thereof facing the first circuit member.

Moreover, the epoxy compound contained in the second layer reacts with the epoxy resin contained in the first layer upon bonding, so that the bonding force between the first layer and the second layer can be improved.

Moreover, by making the minimum melt viscosity of the conductive particle-containing organic resin layer to be ten times or more greater than the minimum melt viscosity of the insulating organic resin layer, the efficiency of the conductive particles can be improved.

<5> A method for producing a joined structure, including pressure-bonding a first circuit member and a second circuit member together via the connecting film according to any of <1> to <3> while the circuit members are being heated, to thereby join the circuit members with each other.

The method for producing a joined structure described in <5> can produce a connecting film which is excellent in both the efficiency of capturing the conductive particles and the conduction reliability, because the first circuit member and the second circuit member are pressure-bonded via the connecting film according to any of <1> to <3> while the circuit members are being heated, to thereby join the circuit members with each other.

<6> A method for producing a joined structure according to <5>, wherein the first circuit member is a LCD panel, and the second circuit member has a polyimide film as the nitrogen atom-containing film and is one of an IC chip and a TAB tape, wherein the pressure-bonding includes temporarily attaching the first layer to the LCD panel, temporarily arranging the polyimide film to be in contact with the second layer, and pressure-bonding the first circuit member and the second circuit member together via the connecting film while the circuit members are heated from the side of the second circuit member by heat pressing, to thereby join the circuit members with each other.

The present invention can provide a connecting film which is excellent in both the efficiency of capturing the conductive particles and the conduction reliability; a joined structure; and a method for producing the joined structure. These can solve the existing problems and achieve the above objects.

An object of the present invention is to provide a connecting film which is excellent in both the efficiency of capturing the conductive particles and the conduction reliability, and a joined structure and a method for producing the joined structure.

DETAILED DESCRIPTION OF THE INVENTION

Joined Structure

A joined structure of the present invention includes a first circuit member, a second circuit member and a connecting film; and, if necessary, includes appropriately selected other members.

Figure 1:
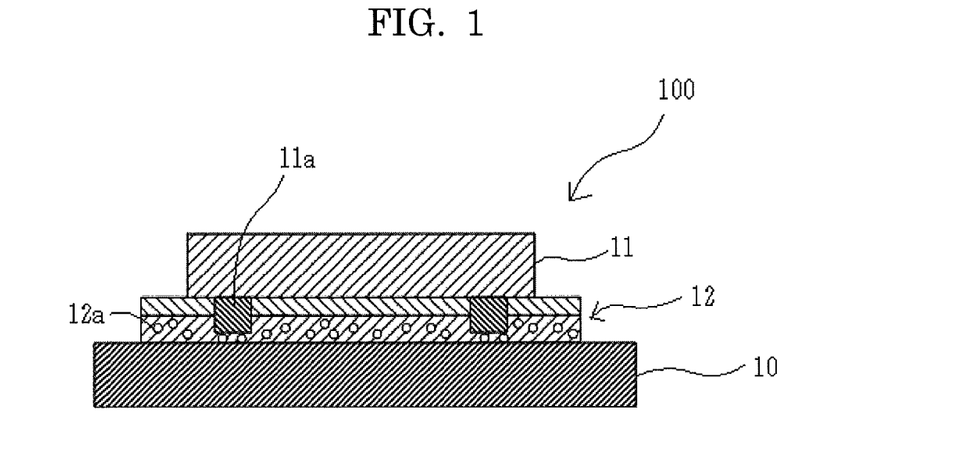
FIG. 1 is a schematic explanatory view showing an example of a joined structure of the present invention.

For example, as shown in FIG. 1, a joined structure 100 has an LCD panel 10 as the first circuit member, an IC chip 11 as the second circuit member, and a connecting film 12. When terminals 11*a* of the IC chip 11 are conducted through conductive particles 12*a* in the connecting film 12 to unillustrated terminals of the LCD panel 10, the LCD panel 10 and the IC chip 11 are electrically connected with each other.

<First Circuit Member>

The first circuit member is not particularly limited and may be appropriately selected depending on the intended purpose. Examples thereof include LCD glass substrates (LCD panels), PDP glass substrates (PDP panels) and organic EL glass substrates (organic EL glass panels).

Also, the first circuit member has metal wires made, for example, of aluminum. When the first circuit member has wires made of a material which does not transmit light (e.g., aluminum), it is difficult to photo-cure the resin contained in a connecting film. Thus, the resin contained in the connecting film is preferably a thermosetting resin.

<Second Circuit Member>

The second circuit member is not particularly limited, so long as it has a nitrogen atom-containing film on the surface facing the first circuit member, and may be appropriately selected depending on the intended purpose. Examples thereof include IC chips each having a polyimide-containing passivation film, IC chips each having an $Si_3N_4$-containing passivation film, and TAB tapes each having a mounted IC chip.

Also, the second circuit member may be made of a material which does not transmit light. When the second circuit member is made of such material which does not transmit light, it is difficult to photo-cure the resin contained in a connecting film. Thus, the resin contained in the connecting film is preferably a thermosetting resin.

<Connecting Film>

The connecting film includes a first layer and a second layer; and, if necessary, further includes an appropriately selected other layer. One of the first layer and the second layer is a conductive particle-containing organic resin layer and the other is an insulating organic resin layer containing no conductive particles.

Figure 2:
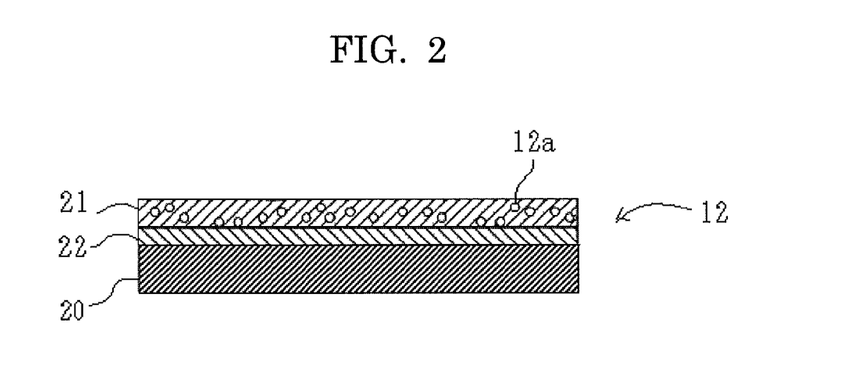
FIG. 2 is a schematic explanatory view showing an example of a connecting film of the present invention.

For example, as shown in FIG. 2, a conductive film 12 has a release layer (separator) 20, an insulating organic resin layer 22 serving as the second layer, and a conductive particle-containing organic resin layer 21 serving as the first layer, wherein the insulating organic resin layer 22 is formed on the release layer (separator) 20, and the conductive particle-containing organic resin layer 21 is formed on the insulating organic resin layer 22.

The conductive film 12 is attached, for example, such that the conductive particle-containing organic resin layer 21 faces the LCD panel 10 (FIG. 1). Thereafter, the release layer (separator) 20 is peeled off, and the IC chip 11 (FIG. 1) is pressure-bonded from the side of the insulating organic resin layer 22, whereby the joined structure 100 (FIG. 1) is produced.

<<First Layer>>

The first layer is not particularly limited, so long as it is located at the first circuit member side, and contains a cationic curing agent and an epoxy resin, and may be appropriately selected depending on the intended purpose.

Preferably, the first layer further contains conductive particles to be a conductive particle-containing organic resin layer. In this case, the second layer described below is designed as an insulating organic resin layer containing no conductive particles.

<<<Cationic Curing Agent>>>

The cationic curing agent is not particularly limited and may be appropriately selected depending on the intended purpose. Examples thereof include sulfonium salts and onium salts, with aromatic sulfonium salts being preferred.

<<<Epoxy Resin>>>

The epoxy resin is not particularly limited and may be appropriately selected depending on the intended purpose. Examples thereof include thermosetting epoxy resins such as bisphenol A type epoxy resins, bisphenol F type epoxy resins, novolac type epoxy resins and modified epoxy resins thereof. These may be used individually or in combination.

<<<Conductive Microparticles>>>

The conductive particles are not particularly limited and may be metal particles or metal-coated resin particles having a particle diameter of 1 μm to 50 μm, each particle having the same composition as particles used in conventional anisotropic conductive adhesives (e.g. connecting film).

Examples of the metal particles include nickel particles, cobalt particles and copper particles. For preventing surface oxidization of the particles, their surfaces may be coated with gold or palladium. Further, the surfaces of the particles may be provided with an insulative film using metal protrusions and/or organic compounds.

Examples of the metal-coated resin particles include perfectly spherical particles plated by one or more metals such as nickel, cobalt and copper. Similarly, the outermost surfaces of the particles may be coated with gold or palladium. Further, the surfaces thereof may be provided with an insulative film using metal protrusions and/or organic compounds.

<<Second Layer>>

The second layer is not particularly limited, so long as it is located at the second circuit member side, and contains a radical curing agent, an acrylic resin and an epoxy compound and may be appropriately selected depending on the intended purpose.

The second layer preferably contains hydroxyl group-containing acrylate in terms of adhesive properties to the polar circuit member.

Moreover, the second layer is preferably an insulating organic resin layer containing no conductive particles, but the second layer may contain conductive particles to be a conductive particle-containing organic resin layer. In this case, the first layer is designed as an insulating organic resin layer.

<<<Radical Curing Agent>>>

The radical curing agent is not particularly limited and may be appropriately selected depending on the intended purpose. Examples thereof include organic peroxides.

<<<Acrylic Resin>>>

The acrylic resin is not particularly limited and may be appropriately selected depending on the intended purpose. Examples thereof include acrylic resins such as methyl(meth)acrylate, ethyl(meth)acrylate, isopropyl(meth)acrylate, isobutyl(meth)acrylate, epoxy(meth)acrylate, ethylene glycol di(meth)acrylate, diethylene glycol di(meth)acrylate, trimethylolpropane tri(meth)acrylate, dimethyloltricyclodecane di(meth)acrylate, tetramethyleneglycol tetra(meth)acrylate, 2-hydroxy-1,3-di(meth)acryloxypropane, 2,2-bis[4-((meth)acryloxymethoxy)phenyl]propane, 2,2-bis[4-((meth)acryloxyethoxy)phenylpropane, dicyclopentenyl (meth)acrylate, tricyclodecanyl(meth)acrylate, tris((meth)acryloxyethyl)isocyanurate and urethane(meth)acrylate. These may be used singly or in combination, as the acrylic resin.

<<<Epoxy Compound>>>

The epoxy compound is not particularly limited and may be appropriately selected depending on the intended purpose. For example, those similar to the above-mentioned epoxy resin are used as the epoxy compound.

The epoxy compound contained in the second layer reacts with an epoxy resin contained in the first layer upon pressure-bonding. As a result, both radical curing due to an acrylic resin and cationic curing due to an epoxy resin occur in the portion of the second layer adjacent to or in contact with the first layer to form a mixed layer. Owing to the mixed layer, the bonding force between the first layer and the second layer outstandingly improves.

The epoxy compound has a molecular weight of preferably 900 to 50,000, more preferably 5,000 to 40,000, and particularly preferably 10,000 to 30,000.

When the molecular weight of the epoxy compound is less than 900, the unreacted epoxy compound cannot be included in a network of the cured second layer, thus the adhesion strength of the second layer may decrease. When the molecular weight of the epoxy compound is more than 50,000, the viscosity of the uncured second layer increases so that the efficiency of capturing particles may decrease.

The epoxy compound has an epoxy equivalent of preferably 450 to 5,000, more preferably 1,000 to 4,500, and particularly preferably 2,000 to 4,000.

When the epoxy equivalent of the epoxy compound is less than 450, the epoxy compound cannot be included in the network of the cured second layer because of its small molecular weight, and a remaining unreacted epoxy resin may shorten film life. When the epoxy equivalent of the epoxy compound is more than 5,000, the number of the epoxy functional groups are not enough to sufficiently react with the epoxy resin of the first layer, and the bonding force between the layers may not sufficiently increases.

<<<Hydroxyl Group-Containing Acrylate>>>

The hydroxyl group-containing acrylate is not particularly limited, so long as the acrylate contains one or more hydroxyl groups in a molecule, and may be appropriately selected depending on the intended purpose.

The acid value of the hydroxyl group-containing acrylate is preferably 1 mgKOH/g to 360 mgKOH/g, more preferably 10 mgKOH/g to 300 mgKOH/g, and particularly preferably 50 mgKOH/g to 250 mgKOH/g.

When the acid value of the hydroxyl group-containing acrylate is less than 1 mgKOH/g, the adhesion strength may be poor. When the acid value of the hydroxyl group-containing acrylate is more than 360 mgKOH/g, the electrode may be corroded.

<<Ratio of Minimum Melt Viscosities>>

The minimum melt viscosity of the conductive particle-containing organic resin layer is preferably 10 times or more, more preferably 13 times or more, greater than the minimum melt viscosity of the insulating organic resin layer.

When the minimum melt viscosity of the conductive particle-containing organic resin layer is less than 10 times of the minimum melt viscosity of the insulating organic resin layer, the efficiency of capturing the conductive particles cannot sufficiently improve.

In terms of conductivity, the minimum melt viscosity of the conductive particle-containing organic resin layer is preferably 1,000 times or less, greater than that of the insulating organic resin layer.

<<Other Layer>>

The other layers are not particularly limited and may be appropriately selected depending on the intended purpose. Examples thereof include a release layer.

The shape, structure, size, thickness, material, etc. of the release layer are not particularly limited and may be appropriately selected depending on the intended purpose. Preferably, it has excellent releasability or high heat resistance. Preferred examples thereof include transparent release polyethylene terephthalate (PET) sheet on which a releasing agent (e.g., silicone) has been applied. Also, a polytetrafluoroethylene (PTFE) sheet may be used.

<Other Members>

The other members are not particularly limited and may be appropriately selected depending on the intended purpose. Examples thereof include silane coupling agents and surfactants.

(Method for Producing Joined Structure)

A method for producing the joined structure of the present invention includes at least a joining step; and, if necessary, further includes an appropriately selected other step.

<Joining Step>

The joining step is a step of pressure-bonding first and second circuit members together via the connecting film of the present invention while the circuit members are being heated, thereby joining the circuit members with each other.

The heating is determined by the total amount of heat. When the joining is completed by connecting the circuit members with each other for 10 sec or shorter, the heating is performed at a heating temperature of 120° C. to 220° C.

The pressure-bonding is performed in consideration of the type of the second circuit member. In the case of a TAB tape, the pressure-bonding is performed at a pressure of 2 MPa to 6 MPa, and in the case of an IC chip, the pressure-bonding is performed at a pressure of 20 MPa to 120 MPa. In either case, the pressure-bonding is performed for 3 sec to 10 sec.

Notably, the joining may be performed through ultrasonication and heating.

Here, in the case where the first circuit member is a LCD panel, and the second circuit member has a polyimide film and is one of an IC and a TAB tape, in the pressure-bonding step, the first layer is temporarily attached to the LCD panel, and the polyimide film is temporarily arranged to be in contact with the second layer, and then the first circuit member and the second circuit member are preferably pressure-bonded together via the connecting film while the circuit members are heated from the side of the second circuit member by heat pressing, to thereby join the circuit members with each other.

Thus, by pressure-bonding the first circuit member and the second circuit member from the side of the second circuit member, the heat pressing device is brought into contact with the second circuit member so as to heat the resin of the second layer. Consequently, the melt viscosity of the second layer decreases and the resin thereof comes to easily flow. Thus, the conductive particles of the first resin can be efficiently captured.

EXAMPLES

The present invention will next be described by way of Examples and Comparative Examples. However, Examples should not be construed as limiting the present invention thereto. All part(s) are expressed by mass unless indicated otherwise.

Production Example 1

Cationic-Curable Electrode-Adhering Sheet C1

Conductive particles (product name: AUL704, product of SEKISUI CHEMICAL CO., LTD.) were dispersed in an adhesive so that the density of particles was adjusted to 30,000/mm$^2$, the adhesive containing 50 parts of a phenoxy resin (product name: YP-50, product of Tohto Kasei Co., Ltd.), 35 parts of an epoxy resin (product name: jER-828, product of Japan Epoxy Resins Co., Ltd.), 1 part of a silane coupling agent (product name: KBM-403, product of Shin-Etsu Chemical Co., Ltd.), 4 parts of a curing agent (product name: SI-60L, product of SANSHIN CHEMICAL INDUSTRY CO., LTD.) and 10 parts of silica fine particles (product name: AEROSIL RY200, product of Nippon Aerosil Co., Ltd.). The resultant dispersion was used to produce a 10 μm-thick cationic-curable electrode-adhering sheet C1.

Specifically, at first, a mixed solution of ethyl acetate and toluene was prepared so as to contain the above-described materials in a solid content of 50%. Next, the mixed solution was applied to a PET film having a thickness of 50 μm, and then dried for 5 min in an oven at 80° C., to thereby obtain a cationic-curable electrode-adhering sheet C1.

The minimum melt viscosity of the cationic-curable electrode-adhering sheet C1 was measured using a rheometer (RS150, product of Haake) at a rate of temperature rise of 10° C./min.

Production Example 2

Cationic-Curable Electrode-Adhering Sheet C2

A cationic-curable electrode-adhering sheet C2 was produced in the same manner as in Production Example 1, except that the amount of the phenoxy resin (product name: YP-50, product of Tohto Kasei Co., Ltd.) was changed from 50 parts to 60 parts, and that silica fine particles (product name: AEROSIL RY200, product of Nippon Aerosil Co., Ltd.) were not added. Then, the minimum melt viscosity of the cationic-curable electrode-adhering sheet C2 was measured.

Production Example 3

Cationic-Curable Electrode-Adhering Sheet C3

A cationic-curable electrode-adhering sheet C3 was produced in the same manner as in Production Example 1, except that the amount of the epoxy resin (product name: jER-828, product of Japan Epoxy Resins Co., Ltd.) was changed from 35 parts to 30 parts, and that 5 parts of an acrylic resin (product name: EB600, product of DAICEL-CYTEC Company LTD.) was added. Then, the minimum melt viscosity of the cationic-curable electrode-adhering sheet C3 was measured.

Production Example 4

Cationic-Curable Electrode-Adhering Sheet C4

A cationic-curable electrode-adhering sheet C4 was produced in the same manner as in Production Example 1, except that silica fine particles (product name: AEROSIL RY200, product of Nippon Aerosil Co., Ltd.) were not added. Then, the minimum melt viscosity of the cationic-curable electrode-adhering sheet C4 was measured.

The composition and minimum melt viscosity of the cationic-curable electrode-adhering sheets C1 to C4 are shown in Table 1.

Production Example 5

Radical-Curable Electrode-Adhering Sheet R1

A 10 μm-thick radical-curable electrode-adhering sheet R1 was produced by using 50 parts of a phenoxy resin (product name: YP-50, product of Tohto Kasei Co., Ltd.), 35 parts of an acrylic resin (product name: EB-600, product of DYCEL-CYTEC COMPANY LTD.), 10 parts of an epoxy compound (product name: jER1001, product of Japan Epoxy Resins Co., Ltd.), 1 part of a silane coupling agent (product name: KBM-503, product of Shin-Etsu Chemical Co., Ltd.) and 4 parts of a curing agent (product name: NYPER BW, product of NOF Corporation).

Specifically, at first, a mixed solution of ethyl acetate and toluene was prepared so as to contain the above-described materials in a solid content of 50%. Next, the mixed solution was applied to a PET film having a thickness of 50 μm, and then dried for 5 min in an oven at 80° C., to thereby obtain a radical-curable electrode-adhering sheet R1.

The minimum melt viscosity of the radical-curable electrode-adhering sheet R1 was measured using a rheometer (product name: RS150, product of Haake) at a rate of temperature rise of 10° C./min.

Production Example 6

Radical-Curable Electrode-Adhering Sheet R2

A radical-curable electrode-adhering sheet R2 was produced in the same manner as in Production Example 5, except that 10 parts of an epoxy compound (product name: jER1010, product of Japan Epoxy Resins Co., Ltd.) was added instead of 10 parts of the epoxy compound (product name: jER1001, product of Japan Epoxy Resins Co., Ltd.). Then, the minimum melt viscosity of the radical-curable electrode-adhering sheet R2 was measured.

Production Example 7

Radical-Curable Electrode-Adhering Sheet R3

A radical-curable electrode-adhering sheet R3 was produced in the same manner as in Production Example 5, except that 10 parts of an epoxy compound (product name: jER4110, product of Japan Epoxy Resins Co., Ltd.) was added instead of 10 parts of the epoxy compound (product name: jER1001, product of Japan Epoxy Resins Co., Ltd.). Then, the minimum melt viscosity of the radical-curable electrode-adhering sheet R3 was measured.

TABLE 1

| | Product name | Type of material | Production Example 1 (C1) | Production Example 2 (C2) | Production Example 3 (C3) | Production Example 4 (C4) |
|---|---|---|---|---|---|---|
| Composition (part) | YP-50 | phenoxy resin | 50 | 60 | 50 | 50 |
| | jER828 | epoxy resin | 35 | 35 | 30 | 35 |
| | EB600 | acrylate | — | — | 5 | — |
| | KBM403 | silane coupling agent | 1 | 1 | 1 | 1 |
| | SI-60L | curing agent | 4 | 4 | 4 | 4 |
| | AEROSIL RY200 | silica fine particles | 10 | — | 10 | — |
| | AUL704 | Conductive particles | Density of particles 30,000/mm$^2$ | | | |
| Minimum melt viscosity [Pa · s] | | | 8,000 | 500 | 6,000 | 500 |

Production Example 8

Radical-Curable Electrode-Adhering Sheet R4

A radical-curable electrode-adhering sheet R4 was produced in the same manner as in Production Example 7, except that the amount of the acrylic resin (product name: EB-600, product of DYCEL-CYTEC COMPANY LTD.) was changed from 35 parts to 30 parts, and that 5 parts of hydroxyl group-containing acrylate (product name: Nk Ester CB-1, product of Shin-Nakamura Chemical Co., Ltd.) was added. Then, the minimum melt viscosity of the radical-curable electrode-adhering sheet R4 was measured.

Production Example 9

Radical-Curable Electrode-Adhering Sheet R5

A radical-curable electrode-adhering sheet R5 was produced in the same manner as in Production Example 5, except that 10 parts of an epoxy compound (product name: jER828, product of Japan Epoxy Resins Co., Ltd.) was added instead of 10 parts of the epoxy compound (product name: jER1001, product of Japan Epoxy Resins Co., Ltd.). Then, the minimum melt viscosity of the radical-curable electrode-adhering sheet R5 was measured.

Production Example 10

Radical-Curable Electrode-Adhering Sheet R6

A radical-curable electrode-adhering sheet R6 was produced in the same manner as in Production Example 5, except that 10 parts of an epoxy compound (product name: YP55, product of Tohto Kasei Co., Ltd.) was added instead of 10 parts of the epoxy compound (product name: jER1001, product of Japan Epoxy Resins Co., Ltd.). Then, the minimum melt viscosity of the radical-curable electrode-adhering sheet R6 was measured.

Production Example 11

Radical-Curable Electrode-Adhering Sheet R7

A radical-curable electrode-adhering sheet R7 was produced in the same manner as in Production Example 5, except that the amount of the phenoxy resin (product name: YP-50, product of Tohto Kasei Co., Ltd.) was changed from 50 parts to 60 parts, and that 10 parts of the epoxy compound (product name: jER1001, product of Japan Epoxy Resins Co., Ltd.) was not added. Then, the minimum melt viscosity of the radical-curable electrode-adhering sheet R7 was measured.

Production Example 12

Radical-Curable Electrode-Adhering Sheet R8

A radical-curable electrode-adhering sheet R8 was produced in the same manner as in Production Example 8, except that the amount of the acrylic resin (product name: EB-600, product of DYCEL-CYTEC COMPANY LTD.) was changed from 30 parts to 35 parts, and that the amount of the hydroxyl group-containing acrylate (product name: Nk Ester CB-1, product of Shin-Nakamura Chemical Co., Ltd.) was changed from 5 parts to 10 parts, and that 10 parts of the epoxy compound (product name: jER4110, product of Japan Epoxy Resins Co., Ltd.) was not added. Then, the minimum melt viscosity of the radical-curable electrode-adhering sheet R8 was measured.

The acid value of the hydroxyl group-containing acrylate (product name: Nk Ester CB-1, product of Shin-Nakamura Chemical Co., Ltd.) was 197 mgKOH/g.

Production Example 13

Radical-Curable Electrode-Adhering Sheet R9

A radical-curable electrode-adhering sheet R9 was produced in the same manner as in Production Example 12, except that 10 parts of the hydroxyl group-containing acrylate (product name: β-CEA, product of DAICEL-CYTEC Company, Ltd.) was added instead of 10 parts of the hydroxyl group-containing acrylate (product name: Nk Ester CB-1, product of Shin-Nakamura Chemical Co., Ltd.). Then, the minimum melt viscosity of the radical-curable electrode-adhering sheet R9 was measured.

The acid value of the hydroxyl group-containing acrylate (product name: β-CEA, product of DAICEL-CYTEC Company, Ltd.) was 365 mgKOH/g.

Production Example 14

Radical-Curable Electrode-Adhering Sheet R10

A radical-curable electrode-adhering sheet R10 was produced in the same manner as in Production Example 12, except that the amount of the phenoxy resin (product name: YP-50, product of Tohto Kasei Co., Ltd.) was changed from 50 parts to 55 parts, and that 5 parts of phosphoric acid acrylate (product name: LIGHT-ESTER P-1M, product of KYOEISHA CHEMICAL Co., LTD.) was added instead of 10 parts of the hydroxyl group-containing acrylate (product name: Nk Ester CB-1, product of Shin-Nakamura Chemical Co., Ltd.). Then, the minimum melt viscosity of the radical-curable electrode-adhering sheet R10 was measured.

Production Example 15

Radical-Curable Electrode-Adhering Sheet R11

A radical-curable electrode-adhering sheet R11 was produced in the same manner as in Production Example 12, except that 10 parts of urethane acrylate (product name: U-2PPA, product of Shin-Nakamura Chemical Co., Ltd.) was added instead of 10 parts of the hydroxyl group-containing acrylate (product name: Nk Ester CB-1, product of Shin-Nakamura Chemical Co., Ltd.). Then, the minimum melt viscosity of the radical-curable electrode-adhering sheet R11 was measured.

The compositions and the minimum melt viscosities of the radical-curable electrode-adhering sheets R1 to R11 are shown in Table 2. The epoxy equivalents and molecular weights of some of the materials are shown in Table 3.

TABLE 2

| | Product name | Type of material | Pro. Ex. 5 (R1) | Pro. Ex. 6 (R2) | Pro. Ex. 7 (R3) | Pro. Ex. 8 (R4) | Pro. Ex. 9 (R5) | Pro. Ex. 10 (R6) | Pro. Ex. 11 (R7) | Pro. Ex. 12 (R8) | Pro. Ex. 13 (R9) | Pro. Ex. 14 (R10) | Pro. Ex. 15 (R11) |
|---|---|---|---|---|---|---|---|---|---|---|---|---|---|
| Composition (parts) | YP-50 | phenoxy resin | 50 | 50 | 50 | 50 | 50 | 50 | 60 | 50 | 50 | 55 | 50 |
| | EB-600 | acrylate | 35 | 35 | 35 | 30 | 35 | 35 | 35 | 35 | 35 | 35 | 35 |

TABLE 2-continued

| Product name | Type of material | Pro. Ex. 5 (R1) | Pro. Ex. 6 (R2) | Pro. Ex. 7 (R3) | Pro. Ex. 8 (R4) | Pro. Ex. 9 (R5) | Pro. Ex. 10 (R6) | Pro. Ex. 11 (R7) | Pro. Ex. 12 (R8) | Pro. Ex. 13 (R9) | Pro. Ex. 14 (R10) | Pro. Ex. 15 (R11) |
|---|---|---|---|---|---|---|---|---|---|---|---|---|
| jER828 | epoxy compound | — | — | — | — | 10 | — | — | — | — | — | — |
| jER1001 | epoxy compound | 10 | — | — | — | — | — | — | — | — | — | — |
| jER1010 | epoxy compound | — | 10 | — | — | — | — | — | — | — | — | — |
| jER4110 | epoxy compound (phenoxy resin containing epoxy) | — | — | 10 | 10 | — | — | — | — | — | — | — |
| YP55 | epoxy compound (phenoxy resin containing epoxy) | — | — | — | — | — | 10 | — | — | — | — | — |
| Nk Ester CB-1 | hydroxyl group-containing acrylate (197 mgKOH/g) | — | — | — | 5 | — | — | — | 10 | — | — | — |
| β-CEA | hydroxyl group-containing acrylate (365 mgKOH/g) | — | — | — | — | — | — | — | — | 10 | — | — |
| LIGHT-ESTER P-1M | phosphoric acid acrylate | — | — | — | — | — | — | — | — | — | 5 | — |
| U-2PPA | urethane acrylate | — | — | — | — | — | — | — | — | — | — | 10 |
| KBM503 | silane coupling agent | 1 | 1 | 1 | 1 | 1 | 1 | 1 | 1 | 1 | 1 | 1 |
| NYPER BW | curing agent | 4 | 4 | 4 | 4 | 4 | 4 | 4 | 4 | 4 | 4 | 4 |
| Minimum melt viscosity [Pa · s] | | 300 | 300 | 600 | 600 | 500 | 800 | 500 | 300 | 300 | 300 | 300 |

Pro. Ex. means Production Example.

TABLE 3

| | Epoxy equivalent | Molecular weight |
|---|---|---|
| YP55 | 10,000 to 20,000 | 50,000 to 60,000 |
| jER828 | 184 to 194 | 370 |
| jER1001 | 450 to 500 | 900 |
| jER1010 | 3,000 to 5,000 | 5,500 |
| jER4110 | 3,500 to 4,000 | About 50,000 |
| EB-600 | — | 600 |

Example 1

Via an electrode-adhering sheet formed by laminating two layers of the cationic-curable electrode-adhering sheet C1 produced in Production Example 1 and the radical-curable electrode-adhering sheet R1 produced in Production Example 5, an IC chip (dimension: 1.8 mm×20.0 mm, thickness: 0.5 mm, gold bump size: 30 μm×85 μm, bump height: 15 μm, bump pitch: 50 μm) was connected with an aluminum-patterned glass substrate (product of Corning Incorporated, 1737F, size: 50 mm×30 mm×0.5 mm), the pattern of which corresponding to that of the IC chip, whereby a joined structure was produced.

The radical-curable electrode-adhering sheet R1 was adhered to the IC chip and the cationic-curable electrode-adhering sheet C1 was adhered to the aluminum-patterned glass substrate. As the passivation film of the IC chip, polyimide was used. Here, the connection of the IC chip with the aluminum-patterned glass substrate was performed by driving in the IC chip for 5 sec at 180° C. and 80 MPa.

Example 2

A joined structure of Example 2 was produced in the same manner as in Example 1, except that the radical-curable electrode-adhering sheet R1 of Example 1 was replaced by the radical-curable electrode-adhering sheet R2 produced in Production Example 6.

Example 3

A joined structure of Example 3 was produced in the same manner as in Example 1, except that the radical-curable electrode-adhering sheet R1 of Example 1 was replaced by the radical-curable electrode-adhering sheet R3 produced in Production Example 7.

Example 4

A joined structure of Example 4 was produced in the same manner as in Example 1, except that the radical-curable electrode-adhering sheet R1 of Example 1 was replaced by the radical-curable electrode-adhering sheet R4 produced in Production Example 8.

Example 5

A joined structure of Example 5 was produced in the same manner as in Example 1, except that the radical-curable electrode-adhering sheet R1 of Example 1 was replaced by the radical-curable electrode-adhering sheet R5 produced in Production Example 9.

Example 6

A joined structure of Example 6 was produced in the same manner as in Example 1, except that the radical-curable electrode-adhering sheet R1 of Example 1 was replaced by the radical-curable electrode-adhering sheet R6 produced in Production Example 10.

Comparative Example 1

A joined structure of Comparative Example 1 was produced in the same manner as in Example 1, except that the cationic-curable electrode-adhering sheet C1 of Example 1 was replaced by the cationic-curable electrode-adhering sheet C2 produced in Production Example 2, and that the radical-curable electrode-adhering sheet R1 was replaced by the radical-curable electrode-adhering sheet R7 produced in Production Example 11.

Comparative Example 2

A joined structure of Comparative Example 2 was produced in the same manner as in Comparative Example 1, except that the cationic-curable electrode-adhering sheet C2 of Comparative Example 1 was replaced by the cationic-curable electrode-adhering sheet C3 produced in Production Example 3.

Comparative Example 3

A joined structure of Comparative Example 3 was produced in the same manner as in Comparative Example 1, except that the radical-curable electrode-adhering sheet R7 of Comparative Example 1 was replaced by the radical-curable electrode-adhering sheet R2 produced in Production Example 6.

(Evaluation of Joined Structure)

The joined structures produced in Examples 1 to 6 and Comparative Examples 1 to 3 were evaluated as follows.

<Ratio of Minimum Melt Viscosities>

A ratio (ACF/NCF) of a minimum melt viscosity of a conductive particle-containing organic resin layer (ACF) to a minimum melt viscosity of an insulating organic resin layer (NCF) was calculated.

Note that in Examples and Comparative Examples, the cationic-curable electrode-adhering sheet is the conductive particle-containing organic resin layer, and the radical-curable electrode-adhering sheet is the insulating organic resin layer.

<Evaluation of Efficiency of Capturing Particles>

The number of particles on bumps before joining a first circuit member and a second circuit member (the number of particles before joining) in each joined structure was calculated by the following equation.

The number of particles before joining=particle density of conductive particles (number/mm²)×area of bumps (mm²)   Equation Moreover, the number of conductive particles on the bumps after joining the first circuit member and the second circuit member (the number of particles after joining) was counted by a metallurgical microscope.

Then, the efficiency of capturing conductive particles (efficiency of capturing particles) was calculated by the following Equation.

Efficiency of capturing articles=(the number of particles after joining/the number of particles before joining)×100   Equation <Measurement of Die Shear Strength>

The die share strength of each produced joined structure was measured with a die shear tester (product name: Dage2400 product of Nordson DAGE).

<Heat Cycle Test>

Each joined structure was subjected to a heat cycle test a cycle of which included heating at −40° C. for 30 min and heating at 100° C. for 30 min, and the joined structure was taken out per 100 cycles so as to measure connection resistance. The number of cycles at which the connection resistance of the joint structure was more than 50Ω was defined as defect-occurring cycle number.

<Adhesion Strength>

An ITO glass obtained by attaching an ITO film to a glass having 0.7 mm-thick and a flexible printed wiring board (FPC) having a 50 μm pitch were heated and pressure-bonded for 5 sec at 180° C. and 4 MPa via each of the cationic-curable electrode-adhering sheets and the radical-curable electrode-adhering sheets used in Examples 1 to 6 and Comparative Examples 1 to 3, so as to join the ITO glass and the flexible printed wiring board.

Figure 3:
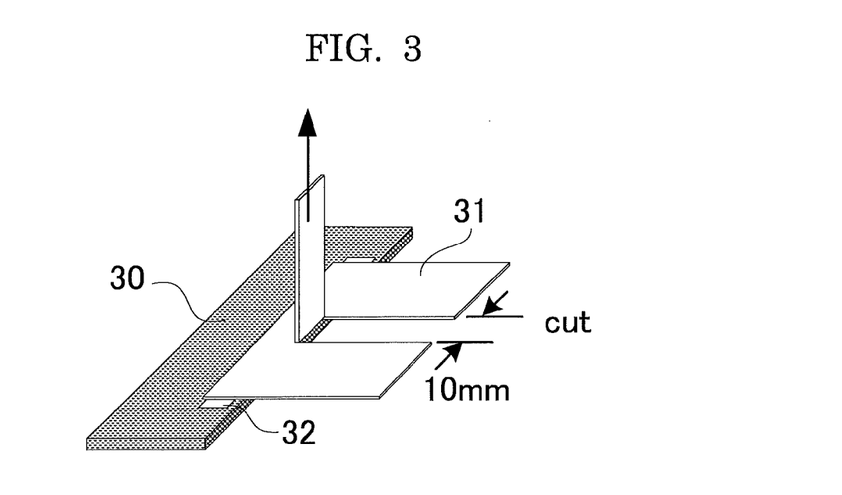
FIG. 3 is a schematic explanatory view showing a method for evaluating adhesion strength.

The adhesion strength of the resultant joined structure was measured with TENSILON (product of ORIENTEC Co., LTD.) by the method shown in FIG. 3. In FIG. 3, the measurement method is 90 degree Peel, a measurement speed is 50 mm/min, and an direction of the arrow is Y direction, 30 denotes glass, 31 denotes FPC or TAB, and 32 denotes ACF.

The results of evaluating the joined structures are shown in Table 4.

TABLE 4

|  | Examples | | | | | | Comparative Examples | | |
| --- | --- | --- | --- | --- | --- | --- | --- | --- | --- |
|  | 1 | 2 | 3 | 4 | 5 | 6 | 1 | 2 | 3 |
| Cationic-curable electrode-adhering sheet | C1 | C1 | C1 | C1 | C1 | C1 | C2 | C3 | C2 |
| Radical-curable electrode-adhering sheet | R1 | R2 | R3 | R4 | R5 | R6 | R7 | R7 | R2 |
| Ratio of minimum melt viscosities [ACF/NCF] | 26.7 | 26.7 | 13.3 | 13.3 | 16.0 | 10.0 | 1.0 | 12.0 | 1.7 |
| Efficiency of capturing particles (%) | 30 | 30 | 30 | 30 | 30 | 30 | 5 | 30 | 5 |
| Die share strength (N/IC) | 100 | 120 | 120 | 120 | 60 | 70 | 100 | 50 | 100 |
| Heat cycle test (defect-occurring cycle) | 1,000 | ≥1,100 | ≥1,100 | ≥1,100 | 800 | 800 | 1,000 | 500 | 1,000 |
| Adhesion strength (N/cm) | 3 | 3 | 3 | 7 | 3 | 3 | 3 | 3 | 3 |

As can be seen from Table 4, the joined structures of Examples 1 to 6 having the structures of the present invention had high efficiency of capturing conductive particles, high adhesion strength, and excellent conduction reliability.

On the other hand, the joined structures of Comparative Examples 1 and 2, in which each of the radical-curable electrode-adhering sheets (the second layer) contained no epoxy compound, had weak die share strength and small defect-occurring cycle number, and could not obtain the sufficient adhesion strength. Thus, the conduction reliability thereof may be impaired.

Each of the joined structures of Comparative Examples 1 and 3, in which the minimum melt viscosity of the conductive particle-containing organic resin layer was less than 10 times greater than the minimum melt viscosity of the insulating organic resin layer, had low efficiency of capturing particles, thus, it my be difficult to apply the joined structures of Comparative Examples 1 and 3 to fine pitch connection.

The joined structure of Comparative Example 1 had poor efficiency of capturing particles, and could not be applied to fine pitch connection, as there was no difference in viscosity between the minimum melt viscosity (500 Pa·s) of the cationic-curable electrode-adhering sheet C2 (ACF) and the minimum melt viscosity (500 Pa·s) of the radical-curable electrode-adhering sheet R7 (NCF). However, due to no difference in viscosity between the minimum melt viscosity (500 Pa·s) of the cationic-curable electrode-adhering sheet C2 (ACF) and the minimum melt viscosity (500 Pa·s) of the radical-curable electrode-adhering sheet R7 (NCF), a mixed layer was easily formed, thereby improving adhesion strength.

The joined structure of Comparative Example 2 had poor adhesion strength, even though it contained an acrylic resin in the cationic-curable electrode-adhering sheet (the first layer). Based on this result, it can be understood that it is essential to contain the epoxy compound in the radical-curable electrode-adhering sheet (the second layer), in order to achieve the object of the present invention.

By comparison between Example 1 and Example 4, in the joined structure of Example 4 containing hydroxyl group-containing acrylate, the adhesion strength was further improved.

The joined structure of Example 5 containing an epoxy compound having small molecular weight, and the joined structure of Example 6 containing large epoxy equivalent were improved compared to the conventional joined structures. However, the joined structures of Example 5 and Example 6 bad poor die share strength and small defect-occurring cycle number, compared to those of Examples 1 to 4.

Reference Example 1

Evaluation of Joined Structure

A joined structure of Reference Example 1 was produced in the same manner as in Comparative Example 1, except that the radical-curable electrode-adhering sheet R7 of Comparative Example 1 was replaced by the radical-curable electrode-adhering sheet R8 produced in Production Example 12.

The conductive resistance of the joined structure was measured and the adhesion strength thereof was measured in the same manner as in Examples and Comparative Examples.
<Evaluation of Corrosive Properties>

A sample for evaluating corrosive properties was formed by bonding the radical-curable electrode-adhering sheet R8 to a comb-drive member for evaluation having an ITO wiring with 15 μm-intervals between the wirings on a 1 mm-thick glass.

The sample was evaluated based on the following three criteria according to the time from when a direct-current voltage 40V was applied to a portion between the wirings of the sample for evaluating corrosive properties in an environment of 40° C. and 90% RH till when corrosion occurred.

A: Corrosion did not occur even over 48 hours.
B: Corrosion occurred in 24 hours to 48 hours.
C: Corrosion occurred before 24 hours passed.

Reference Example 2

A joined structure of Reference Example 2 was produced in the same manner as in Reference Example 1, except that the cationic-curable electrode-adhering sheet C2 was replaced by the cationic-curable electrode-adhering sheet C4 produced in Production Example 4, and that the radical-curable electrode-adhering sheet R8 was replaced by the radical-curable electrode-adhering sheet R9 produced in Production Example 13. Then the conductive resistance, adhesion strength, and corrosive properties of the resultant joined structure were evaluated in the same manner as in Reference Example 1.

Reference Example 3

A joined structure of Reference Example 3 was produced in the same manner as in Reference Example 1, except that the radical-curable electrode-adhering sheet R8 of Reference Example 1 was replaced by the radical-curable electrode-adhering sheet R7 produced in Production Example 11. Then the conductive resistance, adhesion strength, and corrosive properties of the resultant joined structure were evaluated in the same manner as in Reference Example 1.

Reference Example 4

A joined structure of Reference Example 4 was produced in the same manner as in Reference Example 3, except that the radical-curable electrode-adhering sheet R7 of Reference Example 3 was replaced by the radical-curable electrode-adhering sheet R10 produced in Production Example 14. Then the conductive resistance, adhesion strength, and corrosive properties of the resultant joined structure were evaluated in the same manner as in Reference Example 3.

Reference Example 5

A joined structure of Reference Example 5 was produced in the same manner as in Reference Example 2, except that the radical-curable electrode-adhering sheet R9 of Reference Example 2 was replaced by the radical-curable electrode-adhering sheet R11 produced in Production Example 15. Then the conductive resistance, adhesion strength, and corrosive properties of the resultant joined structure were evaluated in the same manner as in Reference Example 2.

The results of evaluations of Reference Examples 1 to 5 are shown in Table 5.

TABLE 5

|  | Reference Examples | | | | |
| --- | --- | --- | --- | --- | --- |
|  | 1 | 2 | 3 | 4 | 5 |
| Cationic-curable electrode-adhering sheet | C2 | C4 | C5 | C5 | C4 |
| Radical-curable electrode-adhering sheet | R8 | R9 | R7 | R10 | R11 |
| Adhesion strength (N/cm) | 7.0 | 7.0 | 3.0 | 5.5 | 5.0 |
| Conductive resistance (Ω) | 0.1 | 0.1 | 0.1 | ≥1 | ≥1 |
| Corrosion properties | A | B | A | B | A |

The joined structures of Reference Examples 1 and 2 exhibited sufficient adhesion strength and low conductive resistance as they used the radical-curable electrode-adhering sheet containing hydroxyl group-containing acrylate. Particularly, it can be understood that the joined structure of Reference Example 1 having low acid value had low corrosive properties and was preferably used as a connecting film.

On the other hand, in the joined structure of Reference Example 3, hydroxyl group-containing acrylate was not contained in the radical-curable electrode-adhering sheet, thus the sufficient adhesion strength could not be obtained.

In the joined structures of Reference Examples 4 and 5, the adhesion strength was improved due to phosphoric acid acrylate and urethane acrylate contained in the radical-curable electrode-adhering sheet. However, conductive resistance was increased because the reaction of the cationic-curable electrode-adhering sheet was inhibited by phosphoric acid acrylate and urethane acrylate, and the uncured condition of the cationic-curable electrode-adhering sheet occurred.

The connecting film, the joined structure and the method for producing the connecting film and the joined structure of the present invention can be preferably use as a connecting film which is excellent in both the efficiency of capturing the conductive particles and the conduction reliability; a joined structure; and a method for producing the joined structure.

What is claimed is:

1. A connecting film which electrically connects a first circuit member with a second circuit member having a nitrogen atom-containing film on a surface thereof facing the first circuit member, the connecting film comprising:
    a first layer which is to be located at the first circuit member side; and
    a second layer which is to be located at the second circuit member side,
    wherein the first layer comprises a cationic curing agent, an epoxy resin and hydrophobic silica fine particles, and the second layer comprises a radical curing agent, an acrylic resin and an epoxy compound,
    wherein the epoxy compound has a molecular weight of 5,000 to 50,000, and an epoxy equivalent of 1,000 to 5,000,
    wherein only the first layer is a conductive particle-containing organic resin layer, and the second layer is an insulating organic resin layer containing no conductive particles,
    wherein the minimum melt viscosity of the conductive particle-containing organic resin layer is ten times or more greater than the minimum melt viscosity of the insulating organic resin layer at a rate of temperature rise of 10° C./min,
    wherein pH of the hydrophobic silica fine particles is 4.0 to 7.0 and a carbon content of the hydrophobic silica fine particles is 3.5-5.5 wt %,
    wherein an amount of the hydrophobic silica fine particles is 10 parts out of 100 parts of the composition of the first layer,
    wherein a BET surface area of the hydrophobic silica fine particles is $100\pm20$ m$^2$/g,
    wherein a particle diameter of the hydrophobic silica fine particles is about 12 nm,
    wherein an apparent specific gravity of the hydrophobic silica fine particles is about 50 g/l, and
    wherein the hydrophobic silica fine particles are treated with dimethyl silicon oil.

2. The connecting film according to claim 1, wherein the second layer further contains hydroxyl group-containing acrylate.

3. The connecting film according to claim 1, wherein the minimum melt viscosity of the conductive particle-containing organic resin layer is 10 times to 1,000 times greater than the minimum melt viscosity of the insulating organic resin layer at a rate of temperature rise of 10° C./min.

4. The connecting film according to claim 1, wherein the first circuit member is one of a LCD panel, a PDP panel and an organic EL panel, and the second circuit member has a nitrogen atom-containing film on a surface facing the first circuit member.

5. The connecting film according to claim 1, wherein the cationic curing agent comprises a sulfonium salt or an onium salt.

6. The connecting film according to claim 1, wherein the epoxy resin comprises a thermosetting epoxy resin.

7. The connecting film according to claim 1, wherein the epoxy resin comprises one selected from the group consisting of bisphenol A epoxy resins, bisphenol F epoxy resins, novolac epoxy resins and modified epoxy resins thereof.

8. The connecting film according to claim 1, wherein the radical curing agent comprises an organic peroxide.

9. The connecting film according to claim 1, wherein the acrylic resin comprises one selected from the group consisting of methyl(meth)acrylate, ethyl(meth)acrylate, isopropyl (meth)acrylate, isobutyl(meth)acrylate, epoxy(meth)acrylate, ethylene glycol di(meth)acrylate, diethylene glycol di(meth)acrylate, trimethylolpropane tri(meth)acrylate, dimethyloltricyclodecane di(meth)acrylate, tetramethyleneglycol tetra(meth)acrylate, 2-hydroxy-1,3-di(meth)acryloxypropane, 2,2-bis[4-((meth)acrloxymethoxy)phenyl]propane, 2,2-bis[4-((meth)acryloxyethoxy)phenyl]propane, dicyclopentenyl(meth)acrylate, tricyclodecanyl(meth)acrylate, tris((meth)acryloxyethyl)isocyanurate and urethane (meth)acrylate.

10. The connecting film according to claim 1, wherein a surface of the hydrophobic silica fine particles have been treated with dimethyl silicone oil.

11. A joined structure comprising:
    a first circuit member; and
    a second circuit member having a nitrogen atom-containing film on a surface thereof facing the first circuit member; and
    a connecting film, which electrically connects the first circuit member with the second circuit member, and comprises:
    a first layer which is to be located at the first circuit member side, and
    a second layer which is to be located at the second circuit member side,
    wherein the first layer comprises a cationic curing agent, an epoxy resin and hydrophobic silica fine particles, and the second layer comprises a radical curing agent, an acrylic resin and an epoxy compound, wherein the epoxy compound has a molecular weight of 5,000 to 50,000, and an epoxy equivalent of 1,000 to 5,000,
    wherein only the first layer is a conductive particle-containing organic resin layer, and the second layer is an insulating organic resin layer containing no conductive particles,
    wherein the minimum melt viscosity of the conductive particle-containing organic resin layer is ten times or more greater than the minimum melt viscosity of the insulating organic resin layer at a rate of temperature rise of 10° C./min,
    wherein pH of the hydrophobic silica fine particles is 4.0 to 7.0 and a carbon content of the hydrophobic silica fine particles is 3.5-5.5 wt %, wherein an amount of the hydrophobic silica fine particles is 10 parts out of 100 parts of the composition of the first layer, wherein the BET surface area of the hydrophobic silica fine particles is $100\pm20$ m$^2$/g, wherein a particle diameter of the hydrophobic silica fine particles is about 12 nm, wherein an apparent specific gravity of the hydrophobic silica fine particles is about 50 g/l, and wherein the hydrophobic silica fine particles are treated with dimethyl silicon oil.

12. The connecting film according to claim 11, wherein a surface of the hydrophobic silica fine particles have been treated with dimethyl silicone oil.

* * * * *